(12) United States Patent
Miyatake (10) Patent No.: US 10,276,253 B2
(45) Date of Patent: Apr. 30, 2019

(54) APPARATUSES AND METHODS INCLUDING ANTI-FUSES AND FOR READING AND PROGRAMMING OF SAME

(71) Applicant: MICRON TECHNOLOGY, INC., Boise, ID (US)

(72) Inventor: Shinichi Miyatake, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/669,256

(22) Filed: Aug. 4, 2017

(65) Prior Publication Data

US 2019/0043597 A1 Feb. 7, 2019

(51) Int. Cl.
| G11C 17/16 | (2006.01) |
| G11C 17/18 | (2006.01) |
| G11C 11/4074 | (2006.01) |
| H01L 23/525 | (2006.01) |
| G11C 29/00 | (2006.01) |

(52) U.S. Cl.
CPC .......... *G11C 17/16* (2013.01); *G11C 11/4074* (2013.01); *G11C 17/165* (2013.01); *G11C 17/18* (2013.01); *G11C 29/787* (2013.01); *H01L 23/5252* (2013.01)

(58) Field of Classification Search
CPC .................................................. G11C 17/165
USPC ....................................................... 365/225.7
See application file for complete search history.

(56) References Cited

U.S. PATENT DOCUMENTS

| 5,604,693 | A | 2/1997 | Merritt et al. |
| 5,672,994 | A | 9/1997 | Tong et al. |
| 6,301,164 | B1 | 10/2001 | Manning et al. |
| 6,424,584 | B1 | 7/2002 | Seyyedy |
| 6,927,997 | B2 * | 8/2005 | Lee .......... G11C 17/16 365/177 |
| 7,339,848 | B1 * | 3/2008 | Stansell .................. G11C 17/18 365/200 |
| 7,508,694 | B2 * | 3/2009 | Terzioglu ................ G11C 17/16 365/225.7 |
| 7,521,764 | B2 * | 4/2009 | Schoellkopf ........ G11C 11/5692 257/321 |
| 7,852,656 | B2 * | 12/2010 | Shin ........................ G11C 17/18 365/225.7 |
| 9,087,588 | B2 * | 7/2015 | Kwon .................... G11C 17/06 |
| 9,281,074 | B2 * | 3/2016 | Wu .................... H01L 27/11206 |
| 9,343,176 | B2 * | 5/2016 | Chung .................... G11C 17/16 |
| 9,460,797 | B2 * | 10/2016 | Chen .................. H01L 27/11526 |
| 9,502,426 | B1 * | 11/2016 | Kuo ................ H01L 21/823462 |
| 9,613,714 | B1 * | 4/2017 | Wong .................... G11C 17/16 |
| 9,634,015 | B2 * | 4/2017 | Wong .................. H01L 23/5226 |
| 9,646,712 | B1 * | 5/2017 | Christensen ........... G11C 17/18 |

(Continued)

FOREIGN PATENT DOCUMENTS

JP 1997017964 11/1998

*Primary Examiner* — Son Mai
(74) *Attorney, Agent, or Firm* — Dorsey & Whitney LLP (57) ABSTRACT

Apparatuses and methods including anti-fuses and for reading and programming same are disclosed herein. An example apparatus may include an anti-fuse element comprising first, second, and third transistors coupled in series between first and second nodes such that the second transistor is between the first and third transistors. The second transistor is configured to be operated such that a punch-through current flows through the second transistor to indicate that the anti-fuse element has been programmed.

8 Claims, 10 Drawing Sheets

(56) References Cited

U.S. PATENT DOCUMENTS

2009/0235040 A1\* 9/2009 Chilumula ............. G11C 7/062
　　　　　　　　　　　　　　　　　　　　　　711/170
2010/0195416 A1\* 8/2010 Akamatsu ............ G11C 7/1072
　　　　　　　　　　　　　　　　　　　　　　365/189.11

\* cited by examiner

APPARATUSES AND METHODS INCLUDING ANTI-FUSES AND FOR READING AND PROGRAMMING OF SAME

BACKGROUND

In recent years, a gate breakdown type anti-fuse has been used in relief circuits of a dynamic random-access memory (DRAM). Together with the large capacity structure and miniaturization of the DRAM devices, the number of defects caused by defective parts has increased. As a result, there has been an increase in the number of anti-fuses included in DRAM devices for relieving the defects. In order to reduce the area of these anti-fuse circuits within a chip, a system for arranging the anti-fuses in an array has been used. However, because it is difficult to carry out breakdown processes of anti-fuses in a stable manner and because of the large increase in a number of anti-fuses, chip yield can be impacted because even a single anti-fuse failure can make the chip defective.

BRIEF DESCRIPTION OF THE DRAWINGS

FIG. 9A is a schematic diagram, FIG. 9B is a cross-sectional diagram.

FIGS. 10A and 10B are cross-sectional diagrams.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
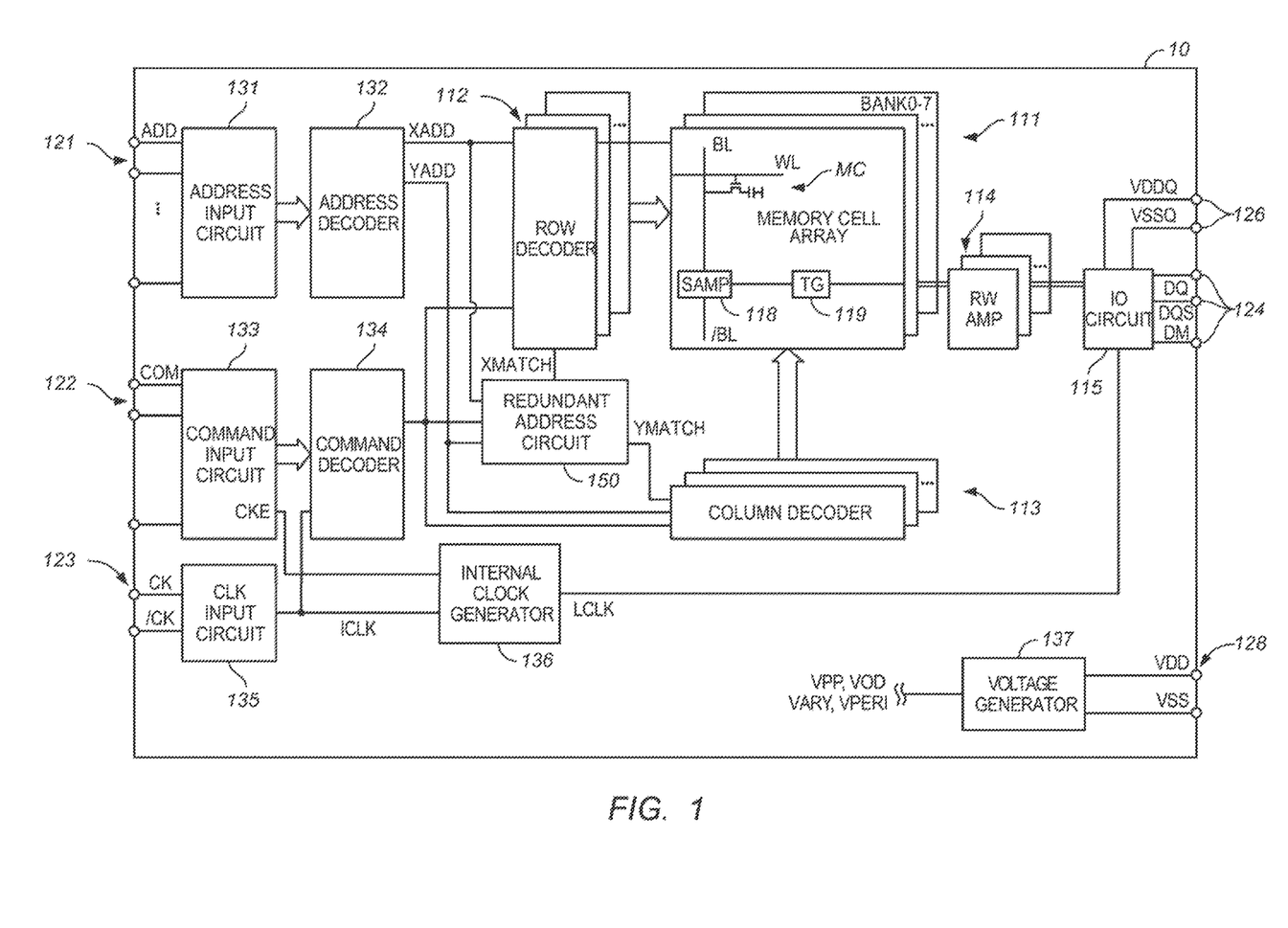
FIG. 1 is a block diagram showing an overall configuration of a semiconductor device according to an embodiment of the present disclosure.

FIG. 1 is a block diagram showing an overall configuration of a semiconductor device 100 according to a first embodiment of the present disclosure. The semiconductor device 100 according to the present embodiment is a synchronous DRAM (SDRAM) of, for example, a Double Data Rate 3 (DDR3) or Double Data Rate 4 (DDR4) type. The semiconductor device 100 may be integrated on a single semiconductor chip and has a memory cell array 111. The memory cell array 111 is provided with a plurality of word lines WL and a plurality of bit lines BL and has a configuration in which memory cells MC are disposed at the intersection points thereof. Selection of the word lines WL is carried out by a row decoder 112, and selection of bit lines BL is carried out by a column decoder 113. The memory cell array 111, the row decoder 112, the column decoder 113, and a read/write amplifier 114 are divided into eight banks BANK0 to BANK7.

Moreover, the semiconductor device 100 is provided with address terminals 121, command terminals 122, clock terminals 123, data terminals 124, and power supply terminals 126 and 128 as external terminals.

The address terminals 121 are the terminals to which address signals ADD are input from outside. The address signals ADD are supplied to an address decoder 132 via an address input circuit 131. The address decoder 132 supplies a row address XADD to the row decoder 112 and supplies a column address YADD to the column decoder 113.

The command terminals 122 are the terminals to which command signals COM are input from outside. The command signals COM are supplied to a command decoder 134 via a command input circuit 133. The command decoder 134 is a circuit which generates various internal commands by decoding the command signals COM. Examples of the internal commands include active signals, pre-charge signals, read/write signals, and refresh signals.

The active signal may include a pulse signal that is activated when the command signal COM is indicating row access (active command). When the active signal is activated, the row decoder 112 of a specified bank address is activated. As a result, the word line WL specified by the row address XADD is selected and activated. The pre-charge signal is a pulse signal which is activated when the command signal COM is indicating pre-charge. When the pre-charge signal is activated, the row decoder 112 of the specified bank address and the word line WL specified by the row address XADD controlled thereby are deactivated.

The read/write signal may include a pulse signal that is activated when the command signal COM is indicating column access (read command or write command). When the read/write signal is activated, the column decoder 113 is activated. As a result, the bit line BL specified by the column address YADD is selected.

Therefore, if the active command and the read command are input and if the row address XADD and the column address YADD are input in synchronization with them, read data is read from the memory cell MC specified by the row address XADD and the column address YADD. The read data DQ is output from the data terminal 124 to outside via a sense amplifier SAMP 118, a transfer gate TG 119, the read/write amplifier 114, and an input/output circuit 115.

On the other hand, if the active command and the write command are input, if the row address XADD and the column address YADD are input in synchronization with them, and, then, if write data DQ is input to the data terminal 124, the write data DQ is supplied to the memory cell array 111 via the input/output circuit 115, the read/write amplifier 114, the transfer gate TG, and the sense amplifier SAMP and is written to the memory cell MC specified by the row address XADD and the column address YADD. It will be appreciated that the write DQ and the read DQ may include multilevel signals, and the input/output circuit 115 may include circuitry to encode and decode multilevel signals.

The refresh signal may include a pulse signal that is activated when the command signal COM is indicating an auto-refresh command. Also, when the command signal COM is indicating a self-refresh entry command, the refresh signal is activated once immediately after command input, thereafter, is cyclically activated at desired internal timing, and a refresh state is continued. By a self-refresh exit command thereafter, the activation of the refresh signal is stopped and returns to an IDLE state.

To help ensure the reliability of the semiconductor device 100, memory cells of the memory cell array 111 are tested to detect defective cells. Typically, to repair a row or column having a defective cell, the memory cell array 111 may include redundant memory rows and columns that can be swapped with a defective row or column, respectively. In order to maintain which rows or columns have been replaced, the semiconductor device 100 may include the redundant address circuit 150. The redundant address circuit 150 may include circuitry that is configured to store row addresses and column addresses that correspond to memory rows or columns that have been determined to be defective. The redundant address circuit 150 may also include circuitry that compares the row address XADD with stored defective row addresses (e.g., and/or compares the column address YADD with stored defective column addresses) to detect a match. The redundant address circuit 150 may provide the XMATCH signal to the row decoder 112 in response to detecting that a memory rows associated with the row address XADD is defective based on the comparison and may provide the YMATCH to the column decoder 113 in response to detecting that a memory column associated with the column address YADD is defective based on the comparison. In response to the XMATCH signal, the row decoder 112 may redirect the row address XADD to a replacement row address associated with a memory row in a redundant portion of the memory cell array 111 when performing previously discussed operations. Similarly, in response to the YMATCH signal, the column decoder 113 may redirect the column address YADD to a replacement column address associated with a memory column in a redundant portion of the memory cell array 111 when performing previously discussed operations. To maintain information associated with defective row and/or column addresses, and/or information associated with redundant memory rows, columns, and/or addresses that have been used to replace defective memory rows, columns, or cells used in the memory cell array 111, the redundant address circuit 150 may include anti-fuse arrays that are programmed based on the defective row and/or column addresses, and/or to store addresses associated with redundant rows, columns, or cells that are allocated to replace a defective memory cell. In some examples, the anti-fuse arrays may include individual anti-fuse elements. Each anti-fuse element may include three serially-coupled metal-oxide semiconductor (MOS) transistors. The anti-fuse elements may be programmed by placing a voltage across the gate of the middle MOS transistor to cause the gate insulating layer to break down and form a hole between the gate and the channel, which may permanently alter the physical properties of the middle transistor. The state of the anti-fuse element may be detected based on whether the physical properties have been altered or not.

External clock signals CK and /CK are input to the clock terminals 123. The external clock signals CK and the external clock signals /CK are mutually complementary signals, and both of them are supplied to the clock input circuit 135. The clock input circuit 135 generates internal clock signals ICLK based on the external clock signals CK and /CK. The internal clock signals ICLK are supplied to the command decoder 134, an internal clock generator 136, etc. The internal clock generator 136 generates internal clock signals LCLK, which control the operation timing of the input/output circuit 115. The internal clock generator 136 may include delay-locked loop (DLL) or phase-locked loop (PLL) circuitry to adjust a phase of the LCLK signal relative to the ICLK signal to align the phase of the DQS signal with the phase of the CK signal. Rather than continuously monitoring the ICLK and LCLK signals to detect phase changes (e.g., caused by voltage or temperature drift, or some other cause), the internal clock generator 136 may further include circuitry that indirectly detects whether disturbance in the CK or LCLK signals has caused a phase drift that requires re-alignment.

The data terminal 124 also receives data mask signals DM, which, when activated, prohibit corresponding data from being overwritten.

The power supply terminals 128 are the terminals to which power supply potentials VDD and VSS are supplied. The power supply potentials VDD and VSS supplied to the power supply terminals 128 are supplied to a voltage generator 137. The voltage generator 137 generates various internal potentials VPP, VOD, VARY, VPERI, etc. based on the power supply potentials VDD and VSS. The internal potential VPP is the potential mainly used in the row decoder 112, the internal potentials VOD and VARY are the potentials used in the sense amplifier SAMP in the memory cell array 111, and the internal potential VPERI is the potential used in many other circuit blocks.

The power supply terminals 126 are the terminals to which power supply potentials VDDQ and VSSQ are supplied. The power supply potentials VDDQ and VSSQ supplied to the power supply terminals 126 are supplied to the input/output circuit 115. The power supply potentials VDDQ and VSSQ are the same potentials as the power supply potentials VDD and VSS, respectively, which are supplied to the power supply terminals 128. However, the dedicated power supply potentials VDDQ and VSSQ are used for the input/output circuit 115 so that power supply noise generated by the input/output circuit 115 does not propagate to other circuit blocks.

Figure 2:
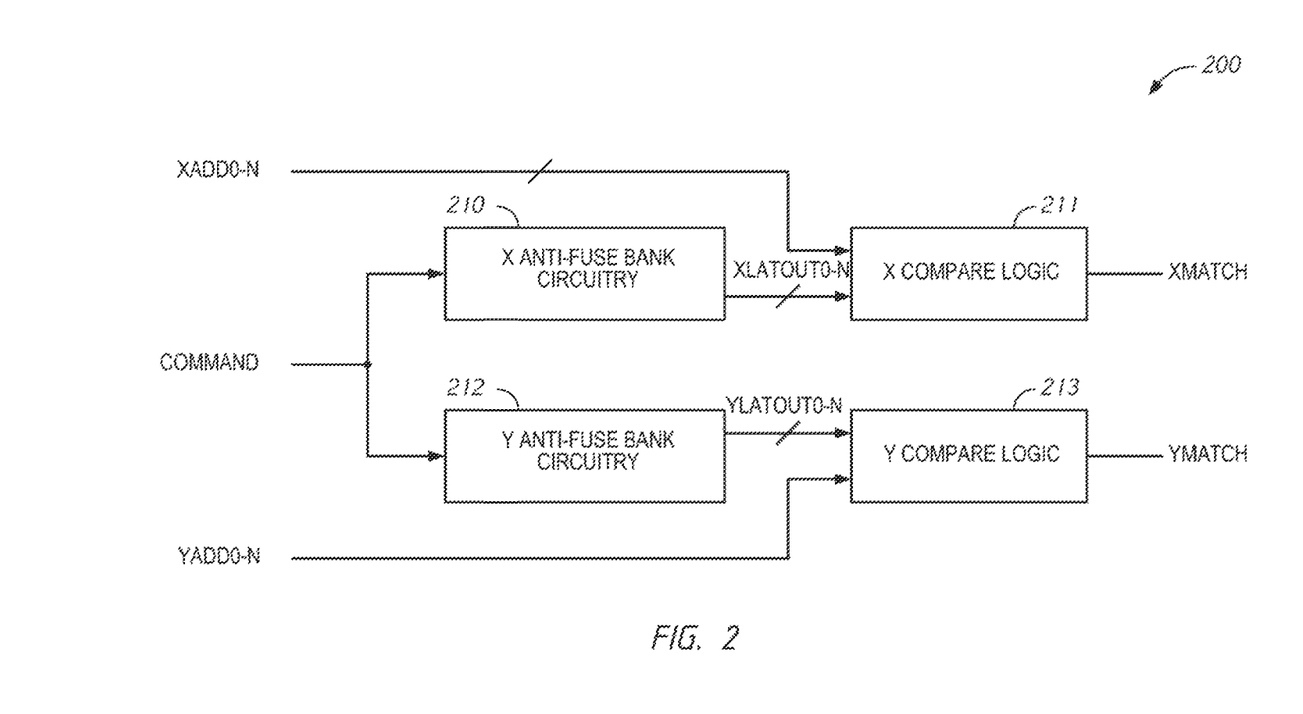
FIG. 2 is a block diagram of a redundant address circuit according to an embodiment of the present disclosure.

FIG. 2 is a block diagram of a redundant address circuit 200 in accordance with an embodiment of the disclosure. The redundant address circuit 200 may include X anti-fuse bank circuitry 210 coupled to X compare logic 211, and Y anti-fuse bank circuitry 212 coupled to compare logic 213. The redundant address circuit 150 of FIG. 1 may implement the redundant address circuit 200.

In response to a command signal, the X anti-fuse bank circuitry 210 may provide latched row address bit signals XLAOUT0-N at an output. The X compare logic 211 may compare the XLAOUT0-N signals with received rows address signals XADD0-N, and may set the XMATCH signal when a match is detected.

In response to the command signal, the Y anti-fuse bank circuitry 212 may provide latched column address bit signals YLAOUT0-N at an output. The compare logic 213 may compare the YLAOUT0-N signals with received column address signals YADD0-N, and may set the YMATCH signal when a match is detected.

Each of the X anti-fuse bank circuitry 210 and the Y anti-fuse bank circuitry 212 may include respective anti-fuse arrays with individual anti-fuse elements. The anti-fuse elements may each include three serially-coupled metal-oxide semiconductor (MOS) transistors. The anti-fuse elements may be programmed by placing a voltage to the gate of the middle MOS transistor to cause the gate insulating layer to break down and form a hole between the gate and the channel, which may permanently alter the physical properties of the middle transistor. To read the anti-fuse element state, differential voltages may be placed at each end of the three serially-couple transistors, and voltages may be provided to the gates of the two outer MOS transistors, and a current through the anti-fuse element is detected. If the current is greater than a reference current, then the anti-fuse element may be programmed state. Otherwise, the anti-fuse element may be determined to an unaltered state.

Each of the X compare logic 211 and the Y compare logic 213 may include logic (e.g., XOR, NAND, AND, OR, etc.) to compare the individual signal lines of the XADD0-N with respective individual signals lines of the XLAOUT0-N and the individual signal lines of the YADD0-N with respective individual signals lines of the YLAOUT0-N. In response to the XLAOUT0-N signals matching the XADD0-N signals, the X compare logic 211 may provide the XMATCH signal indicating a match. Otherwise, the X compare logic 211 may set the XMATCH signal indicating no match. Similarly, in response to the YLAOUT0-N signals matching the YADD0-N signals, the Y compare logic 213 may provide the YMATCH signal indicating a match. Otherwise, the Y compare logic 213 may set the YMATCH signal indicating no match.

Figure 3:
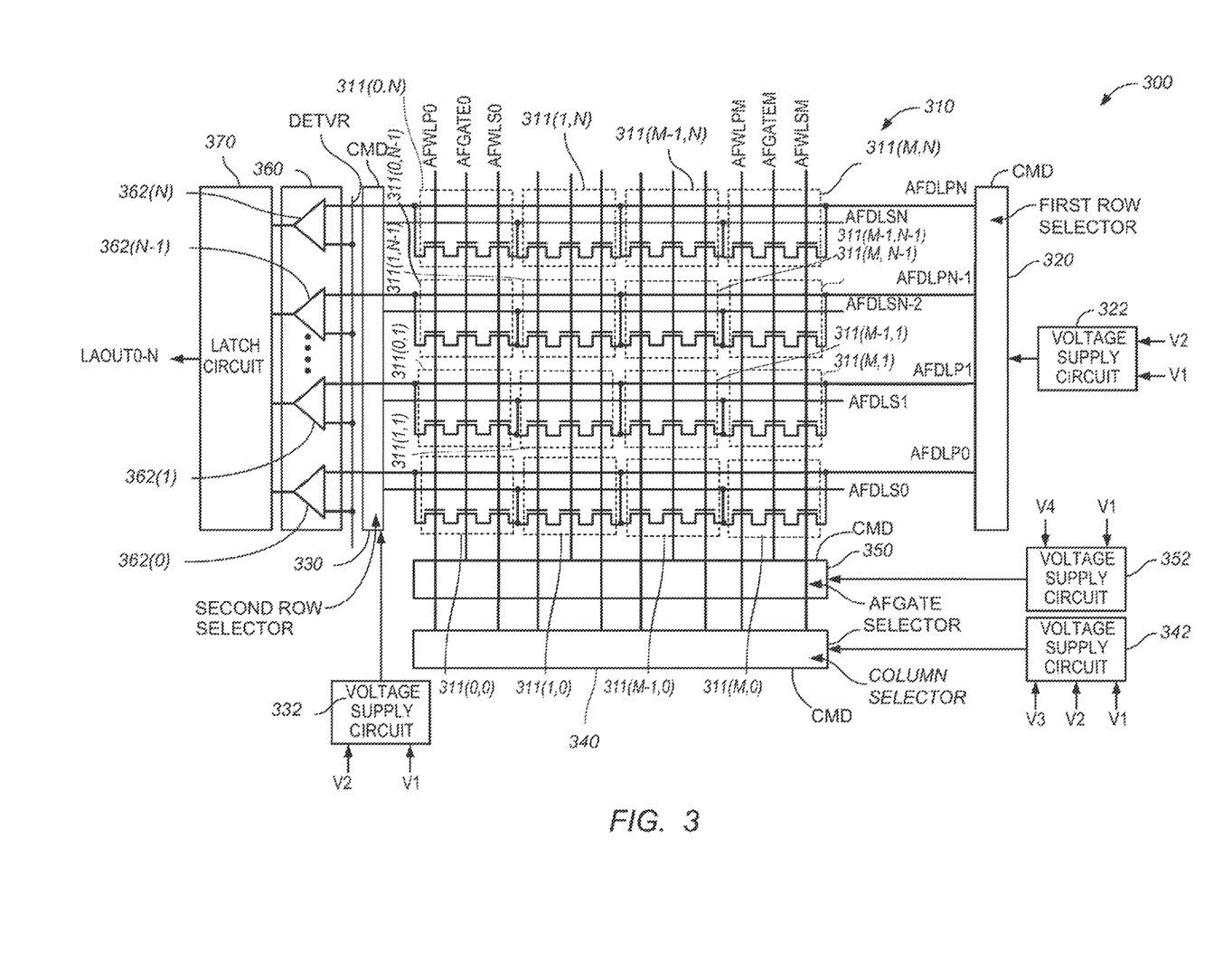
FIG. 3 is a block diagram of anti-fuse bank circuitry according to an embodiment of the present disclosure.

FIG. 3 is a block diagram of anti-fuse bank circuitry 300 in accordance with an embodiment of the disclosure. The anti-fuse bank circuitry 300 may include an anti-fuse bank 310, a detection circuitry 360, and a latch circuit 370. The X anti-fuse bank circuitry 210 and/or the Y anti-fuse bank circuitry 212 of FIG. 2 may implement the anti-fuse bank circuitry 300.

The anti-fuse bank 310 may include an array of fuse elements 311(0,0)-311(M,N). Each of the fuse elements 311(0,0)-311(M,N) may include three serially-coupled MOS transistors. A middle MOS transistor of each of the fuse elements 311(0,0)-311(M,N) may serve as the programmable element to indicate a state of the respective fuse element. The relative sizes of the MOS transistors within each of the fuse elements 311(0,0)-311(M,N) may differ. For example, the first and third MOS transistors of each of the fuse elements 311(0,0)-311(M,N) may each have a first gate length, and the middle MOS transistor of each of the fuse elements 311(0,0)-311(M,N) may each have a second gate length. In some examples, the first gate length is greater than the second gate length. In an example, the MOS transistors within each of the fuse elements 311(0,0)-311(M,N) may be n-type MOS (NMOS) transistor. In other examples, the MOS transistors within each of the fuse elements 311(0,0)-311(M,N) may be p-type MOS (PMOS) transistors.

The fuse elements may be individually selected for reading or programming via a first row selector 320, second row selector 330, column selector 340, and anti-fuse gate selector 350. The first row selector 320 may be coupled to a voltage supply circuit 322 to provide one of a V1 voltage or a V2 voltage to one or more of the data lines AFDLP0-N based on the CMD signal (e.g., indicating a program or read operation). Similarly, the second row selector 330 may be coupled to a voltage supply circuit 332 to provide one of a V1 voltage or a V2 voltage to one or more of the data lines AFDLS0-N based on the CMD signal. The column selector 340 may be coupled to a voltage supply circuit 342 to provide one of a V1 voltage, a V2 voltage, or a V3 voltage to word lines AFWLP0-M and AFWLS0-M based on the CMD signal. The anti-fuse gate selector 350 may be coupled to a voltage supply circuit 352 to provide one of a V1 voltage or a V4 voltage to one or more of the wordlines AFGATE0-M based on the CMD signal. The AFDLP0-N lines may each couple to a drain of a first MOS transistor of each fuse element of a respective row of the fuse elements 311(0,0)-311(M,N). The AFDLS0-N lines may each couple to a source of a third MOS transistor of each fuse element of a respective row of the fuse elements 311(0,0)-311(M,N). The AFWLP0-N lines may each couple to a gate of the first MOS transistor of each fuse element of a respective column of the fuse elements 311(0,0)-311(M,N). The AFWLS0-N lines may each couple to a gate of the third MOS transistor of each fuse element of a respective column of the fuse elements 311(0,0)-311(M,N). The AFGATE0-N lines may each couple to a gate of a middle (e.g., second) MOS transistor of each fuse element of a respective column of the fuse elements 311(0,0)-311(M,N), the V1 voltage may be less than the V2 voltage, the V2 voltage may be less than the V3 voltage, and the V3 voltage may be less than the V4 voltage. In one example, the V1 voltage may be 0 volts, the V2 voltage may be 1.2 volts, the V3 voltage may be 2 volts, and the V4 voltage may be 5 volts. Other voltages may be used without departing from the scope of the disclosure The detection circuitry 360 may include current detect amplifier circuits 362(0)-362(N) configured to compare a reference voltage DETVR with a voltage of a respective one of the AFDLP0-N lines and provide a comparison signal to the latch circuit 370. The latch circuit 370 may latch the outputs of the individual ones of the current detect amplifier circuits 362(0)-362(N) to latch and provide the latched output signals LAOUT0-N.

In operation, the first row selector 320, the second row selector 330, the column selector 340, and the anti-fuse gate selector 350 may operate together to perform a read or program operation on one or more of the fuse elements 311(0,0)-311(M,N) of the anti-fuse bank 310. By way of example, to program fuse element 311(0,N), the first row selector 320, the second row selector 330, the column selector 340, and the anti-fuse gate selector 350 may drive AFDLPN, AFDLSN, AFWLP0 and AFWLS0, and AFGATE0 lines, respectively with voltages that cause programming of the fuse element 311(0,N).

Figure 8A:
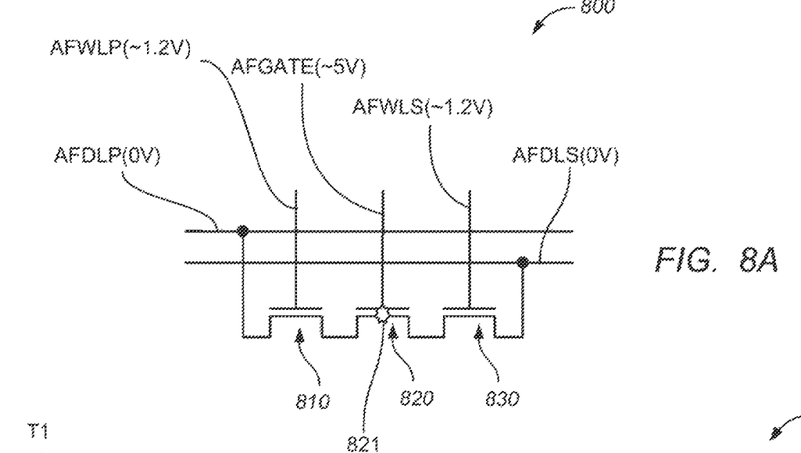
FIG. 8A is a schematic diagram and FIG. 8B is a timing diagram associated with programming of a fuse element according to an embodiment of the present disclosure.
Figure 8B:
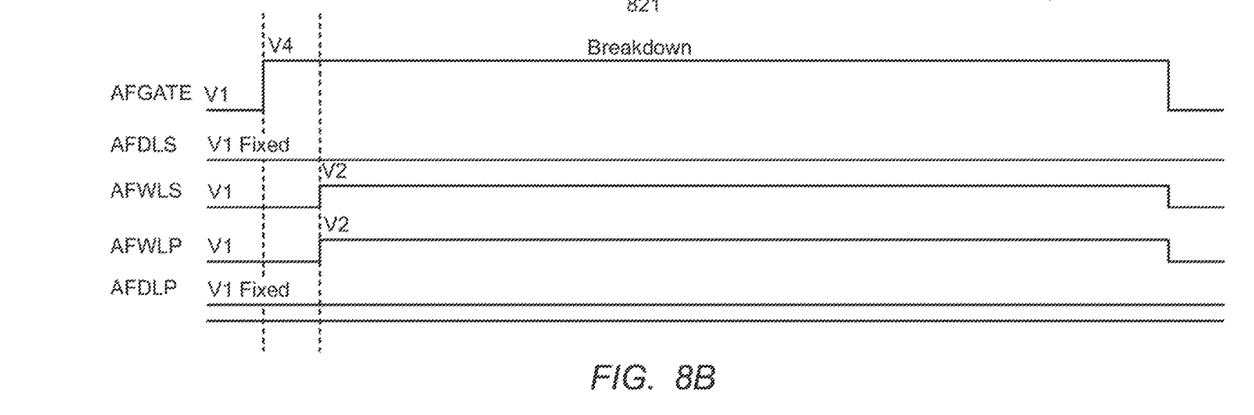

For example, FIG. 8A is a schematic diagram and FIG. 8B is a timing diagram 801 associated with programming of a fuse element 800. In FIG. 8A, the fuse element may include serially-coupled transistors 810, 820 and 830. The AFDLP signal is coupled to a drain of the transistor 810, the AFLDS signal is coupled to a source of the transistor 830, a gate of the transistor 810 is coupled to the AFWLP signal, a gate of the transistor 820 is coupled to the AFWLS line, and a gate of the transistor 830 is coupled to the AFGATE signal.

As shown in the timing diagram, at time T0, the AFGATE signal is driven to the V4 voltage, while the other (e.g., AFDLP, AFDLS, AFWLP, and AFWLS) signals remain at the V1 voltage. At time T1, the AFWLP and AFWLS signals are driven to the V2 voltage. The voltage differential on the AFWLP and AFWLS signals, the AFGATE signal, and the AFDLP and AFDLS signals, may form a current path that flows through and causes breakdown 821 of a gate oxide film of the transistor 820.

The invention uses the fundamental punch through mechanism. When gate of the transistor 820 is broken down, phosphorus in the gate polysilicon is diffused to the channel region so that a diffusion region is produced in the channel region. As a result, a depletion region is further produced at the diffusion region in the channel region. The breakdown of the gate insulating film may occur anywhere along the channel below the gate.

Turning back to FIG. 3, to read a state of the fuse element 311(0,N), the first row selector 320, the second row selector 330, the column selector 340, and the anti-fuse gate selector 350 may drive AFDLPN, AFDLSN, AFWLP0 and AFWLS0, and AFGATE0 lines, respectively with voltages that provide voltages and currents indicative of a state of the fuse element 311(0,N) based on properties of the fuse element 311(0,N). The current detect amplifier circuits 362(0)-362(N) may detect a current on respective AFDLP0-N lines and compare with the DETVR to determine a state of a respective individual fuse element of the fuse elements 311(0,0)-311(M,N).

Figure 9A:
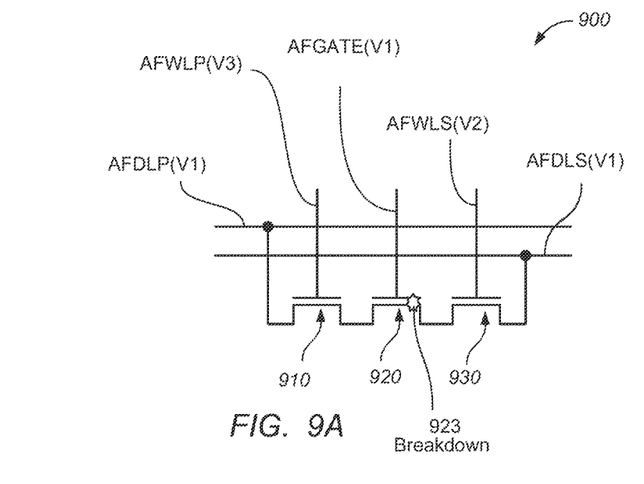
Figure 9B:
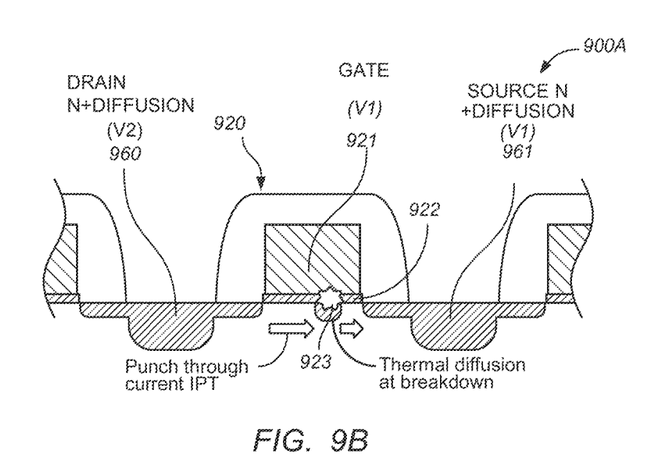
Figure 9C:
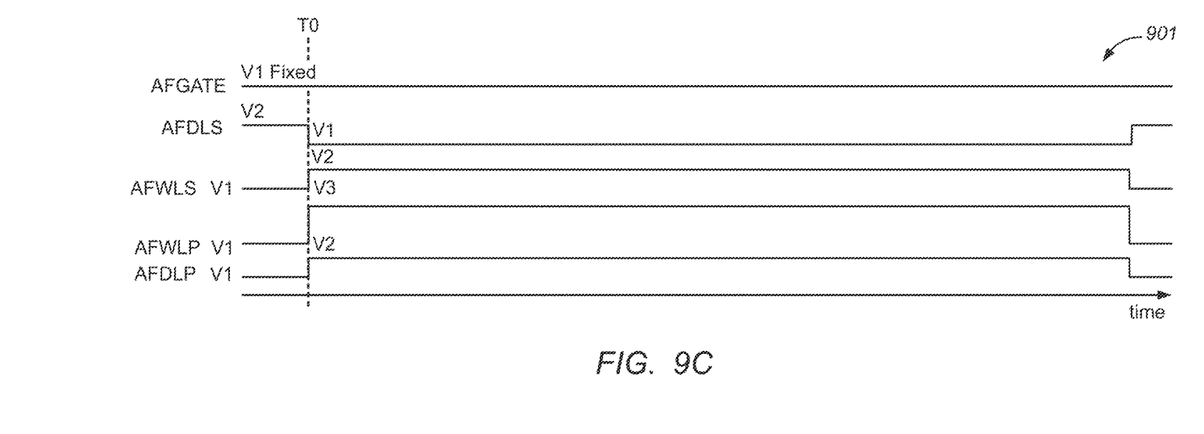
FIG. 9C is a timing diagram associated with reading of a fuse element according to an embodiment of the present disclosure.

FIG. 9A is a schematic diagram of the fuse element 900 and FIG. 9B is a cross sectional view of the transistor 920 of the fuse element 900A. FIG. 9C is a timing diagram associated with reading of the fuse element 900/900A according to an embodiment of the present disclosure. In FIGS. 9A/9B, a drain of the transistor 910 is coupled to the AFDLP signal, a source of the transistor 930 is coupled to the AFDLS signal, a gate of the transistor 910 is coupled to the AFWLP signal, a gate of the transistor 930 is coupled to the AFWLS signal, and a gate of the transistor 920 is coupled to the AFGATE signal.

As shown in the timing diagram 901, prior to time T0, the AFDLS signal is driven to V2 voltage while the other (e.g., AFDLP, AFDLS, AFWLP, and AFGATE) signals are driven to V1 voltage. At time T0, the AFDLS signal is driven to the V1 voltage, the AFWLS signal and the AFDLP signal are each driven to the V2 voltage, and the AFWLP signal is driven to the V3 voltage. The AFGATE signal is fixed at V1 voltage. A defect 923 in the gate insulating film 922 is present in the transistor of the fuse element 900/900A at the time of a breakdown caused by the voltages on the AFDLP, AFDLS, AFWLP, AFWLS, and AFGATE signals. Below the resulting defect 923, an N-type diffusion region is formed in a channel region below the gate insulating film 922 from thermal diffusion of polysilicon doped with phosphorus of the gate 921 at the time when the breakdown conditions are present. With relevance to FIG. 9B, one method to read a state of a MOS anti-fuse 920 is by detecting a resistance between its gate 921 and its source 961 or drain 960 by applying voltage between the gate 921 and the source 961 or drain 960. However, the resistance may depend on a location along the gate where the gate insulating film breakdown occurs. Therefore, the resistance of anti-fuse with MOS may vary widely, making it difficult to set a reference current for reading the state of the anti-fuse. However, regardless of a location of the gate insulating film breakdown, the effective channel length becomes smaller. Therefore, a punch-through current may flow with a lower voltage. For example, normally, if there is no defect 923 in the gate insulating film 922, a punch-through withstand voltage may be a higher voltage (e.g., higher than the V1 voltage). However, when a defect 923 is present in the channel, the punch-through withstand voltage is reduced (e.g., to less than the V1 voltage). Further, when the gate length of the transistor 920 of the fuse element 900/900A is reduced toward a lower design limit, the degree of reduction in the punch-through withstand voltage when comparing a defect 923 versus no defect scenario becomes greater.

Figure 10A:
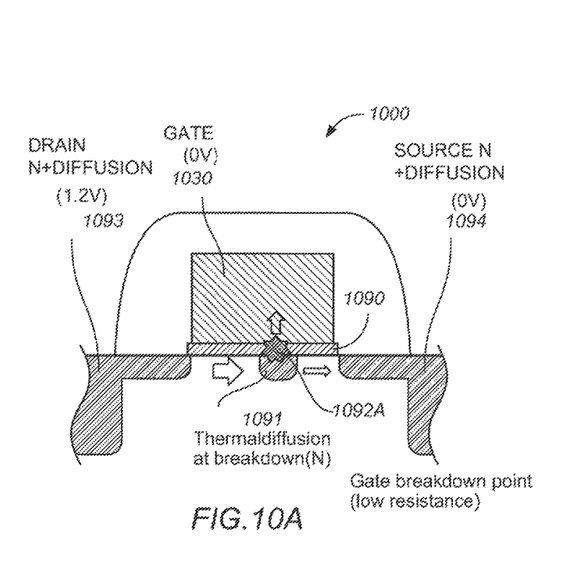
Figure 10B:
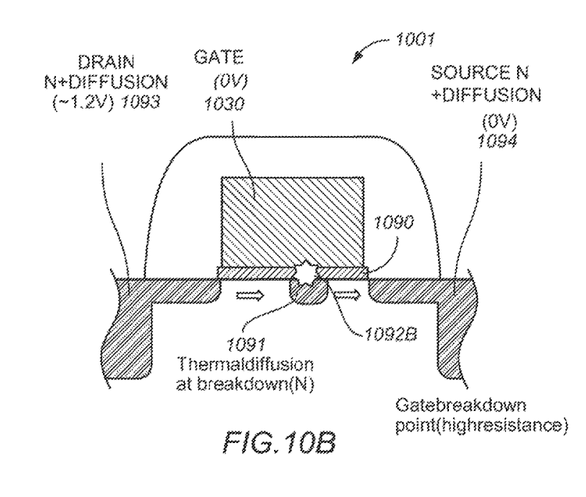
Figure 10C:
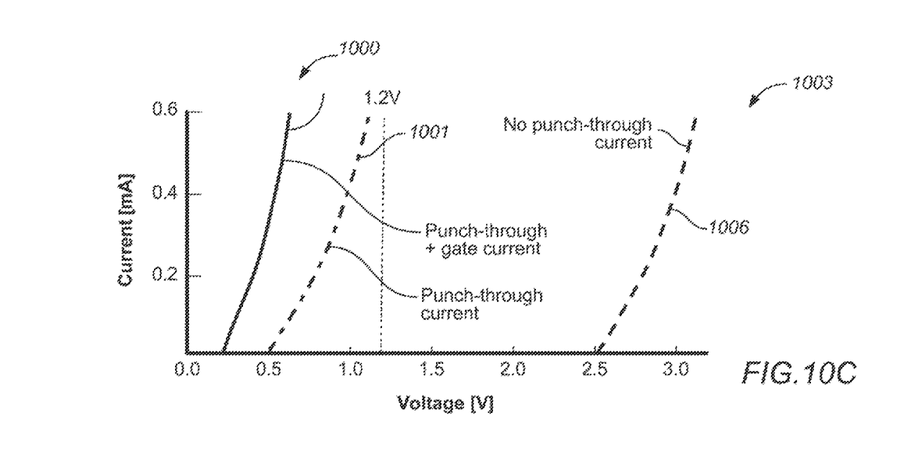
FIG. 10C is a current-voltage (I-V) diagram of I-V characteristics of a fuse element according to an embodiment of the present disclosure.

For example, FIGS. 10A and 10B are cross-sectional diagrams, and FIG. 10C is a current-voltage (I-V) diagram of I-V characteristics of a fuse element according to an embodiment of the present disclosure. Specifically, FIGS. 10A and 10B are cross-sectional diagrams of a punch-through current plus gate current 1000 and a punch through current only 1001, respectively, of a fuse element (e.g., the fuse elements 311(0,0)-311(M,N) of FIG. 3). FIG. 10C is a current-voltage (I-V) diagram 1003 of I-V characteristics of the punch-through current plus gate current 1000 of FIG. 10A, the punch through current only 1001 of FIG. 10B, and a no punch through 1006 scenario. In the first scenario 1008 of FIG. 10A, the anti-fuse element has a defect 1092A and the punch through current flows from the drain N+ diffusion region 1093 through the thermal diffusion region 1091 to both the anti-fuse gate 1030 through the defect 1092A in the gate oxide layer 1090 and to the source N+ diffusion region 1094. The thermal diffusion region 1091 results from the defect 1092A and is formed by break down voltages of the drain N+ diffusion region 1093 (e.g., the V2 voltage) and the voltages of the source N+ diffusion region 1094 and the anti-fuse gate 1030 (e.g., the V1 voltage).

With reference to FIG. 10B, in the second scenario 1001, the punch through current flows from the drain N+ diffusion region 1093 through the thermal diffusion region 1091 to the source N+ diffusion region 1094, and not to the anti-fuse gate 1030 via the defect 1092B. The thermal diffusion region 1091 results from the defect 1092A and is formed by break down voltages of the drain N+ diffusion region 1093 (e.g., the V2 voltage) and the voltages of the source N+ diffusion region 1094 and the anti-fuse gate 1030 (e.g., the V1 voltage). With reference to FIG. 10C, as shown in the I-V diagram 1003, the current of the punch-through plus gate current scenario 1000 (e.g., with defect 1092A) of FIG. 10A and the punch through only scenario 1001 (e.g., with defect 1092B) of FIG. 10B both increase well before the voltage of the drain N+ diffusion region 1093 reaches the V2 voltage. Conversely, the current of the no punch-through scenario 1006 (e.g., no defect) remains at 0 mA until approximately V3.1 voltage. Therefore, using the the V2 voltage level, current flow differences may be used to detect a state of a fuse element.

Based on the I-V characteristics depicted in FIG. 10C, a current on the AFDLP0-N lines may vary based on a state of a target anti-fuse element. The current detect amplifier circuits 362(0)-362(N) may detect the current on the AFDLP0-N lines, and the detected currents may be compared against a reference current (e.g., from which the DETVR is derived) to determine a state of the target anti-fuse element. The DETVR voltage may be generated based on a reference current that is between a current expected in a non-programmed state and a current expected in a programmed state. The latch circuit 370 may set the LAOUT0-N signals based on comparisons between the AFDLP0-N lines and the DETVR. For example, when the DETVR is less than a voltage of one of the AFDLP0-N lines, the corresponding LAOUT0-N signal is set to a logical high value. Otherwise, the corresponding LAOUT0-N signal is set to a logical low value.

The voltages depicted in FIGS. 3, 8A, 8B, 9A-9C, and 10A-10C are exemplary, and other voltages may be used without departing from the scope of the disclosure. Further, the anti-fuse bank 310 may include more or fewer fuse elements than depicted without departing from the scope of the disclosure. While FIG. 3 depicts separate voltage supply circuits 322, 332, 342, and 352, one of more of the voltage supply circuits may be combined together. Implementing the fuse elements with three serially-coupled transistors may allow a more robust programming and reading MOS anti-fuse element as compared with single transistor anti-fuse elements. The smaller channel length in the middle MOS transistor of the anti-fuse elements 311(0,0)-311(M,N) may improve reliability of the anti-fuse elements 311(0,0)-311 (M,N).

Figure 4:
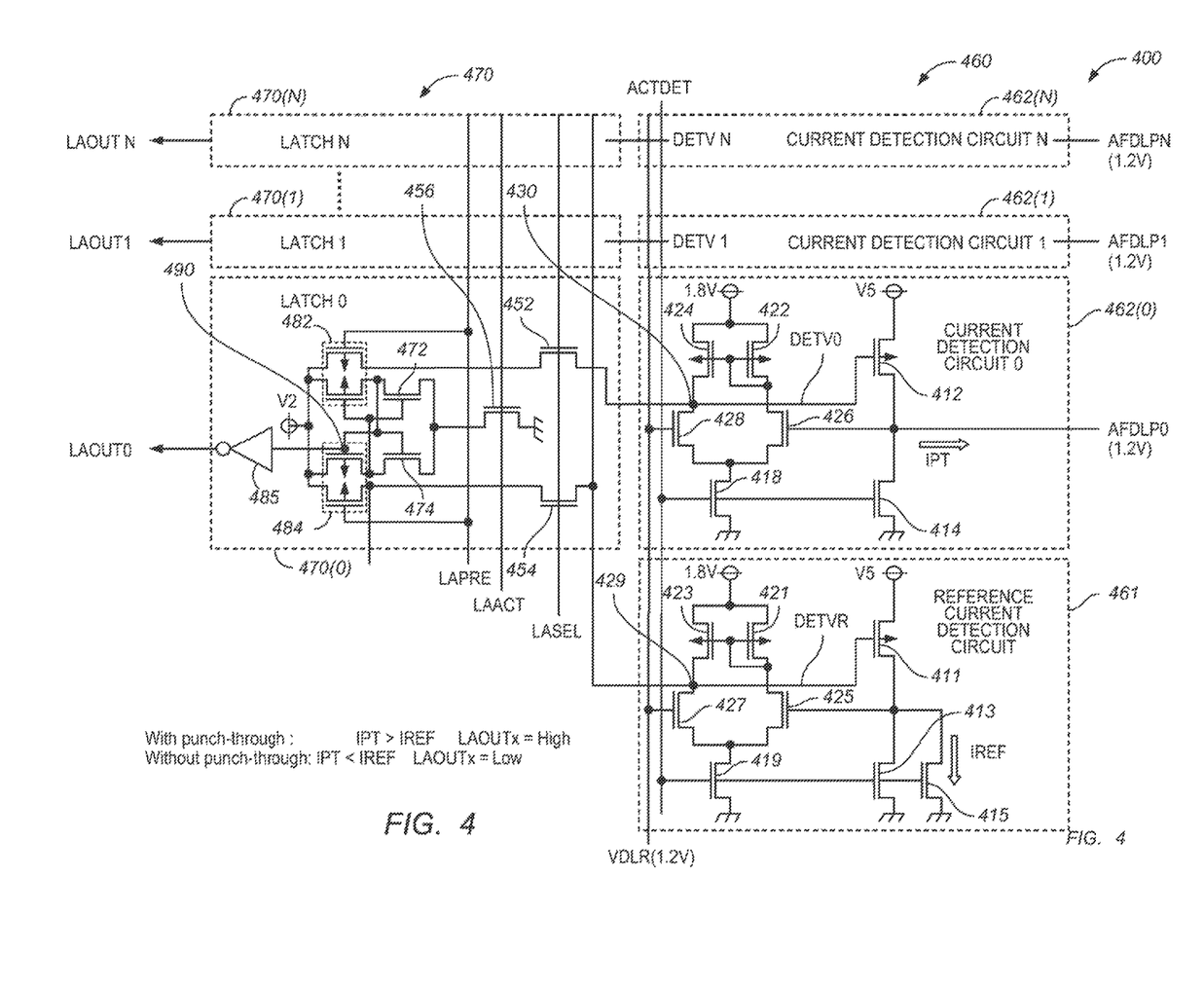
FIG. 4 is a block diagram of a detection and latch circuitry according to an embodiment of the present disclosure.

FIG. 4 is a block diagram of a detection and latch circuitry 400 in accordance with an embodiment of the disclosure. The detection and latch circuitry 400 may include a reference current detection circuit 461 and detection circuitry 460 including current detection circuits 462(0)-462(N) coupled to a latch circuit 470 including respective latches 470(0)-470(N). The detection circuitry 360 and the latch circuit 370 of FIG. 3 may implement the detection and latch circuitry 400.

For clarity, only the current detection circuit 462(0) is depicted in detail. It is understood that the other current detection circuits 462(1)-462(N) may each include circuitry similar to the circuitry depicted in the current detection circuit 462(0), and the foregoing discussion would also apply to the circuitry of those current detection circuits 462(1)-462(N). The current detection circuit 462(0) may include a differential amplifier circuit (e.g., formed by transistors 422, 424, 426, and 428) and a constant voltage supply circuit (e.g., formed by transistors 412 and 414) having a voltage based on the V5 voltage. The V5 voltage may be greater than the V2 voltage and less than the V3 voltage. In some examples, the V5 voltage may be 1.8 volts. The AFDLP0 signal is coupled to a node between the transistors 412 and 414 and to a gate of the transistor 426. The transistor 428 may receive a dataline reference voltage VDLR. The gates of the transistors 422 and 424 may be coupled to a node between the transistors 422 and 426. The DETV0 signal may be coupled to a gate of the transistor 412 and to a node between the transistor 424 and 428. The DETV0 may vary based on a value of the IPT current. The current detection circuit 462(0) may also include a detection/activation transistor 418 that enables the differential amplifier circuit in response to an activation/detection signal ACTDET. The transistors 412, 422, and 424 may be p-type transistors and the transistors 414, 418, 426, and 428 may be n-type transistors.

The reference current detection circuit 461 may include a differential amplifier circuit (e.g., formed by transistors 421, 423, 425, and 427) and a constant voltage supply circuit (e.g., formed by transistors 411 and 413). The reference current detection circuit 461 may further include a transistor 415 that is configured to drive the reference current IREF in conjunction with the transistor 413 based on the ACTDET signal. The transistor 427 may receive the VDLR voltage. The gates of the transistors 421 and 423 may be coupled to a node between the transistors 421 and 425. The DETVR signal may be coupled to a gate of the transistor 411 and to a node between the transistors 423 and 427. The reference current IREF, and the DETVR, may vary based on a size of the transistors of the reference current detection circuit 461. The reference current detection circuit 461 may also include a detection/activation transistor 419 that enables the differential amplifier circuit of the reference current detection circuit 461 in response to an activation/detection signal ACTDET. The transistors 411, 421, and 423 may be p-type transistors and the transistors 413, 415, 419, 425, and 427 may be n-type transistors.

For clarity, only the latch 470(0) is depicted in detail. The other latches 470(1)-470(N) may each include circuitry similar to the circuitry depicted in the latch 470(0), and the foregoing discussion would also apply to the circuitry of those latches 470(1)-470(N). The latch 470(0) includes parallel pass gates 482 and 484. Each of the pass gates may include a pair of parallel transistors. The pass gate 482 is coupled between the V2 voltage source and a transistor 472. The pass gate 484 is coupled between the V2 voltage source and a transistor 474. The latch 470(0) may further include select transistors 452 and 454 and an activation transistor 456. The latch 470(0) may further include an inverter 485 that is coupled to a gate of one of the pair of transistors of the pass gate 484. The transistors of the pass gates 482 and 484 may be p-type transistors and the transistors 452, 454, 456, 472, and 474 may be n-type transistors. The control signals VDLR, ACTDET, LAPRE, LAACT, and LASEL may be provided by a command decoder, such as the command decoder 134 of FIG. 1, in some examples.

Figure 5:
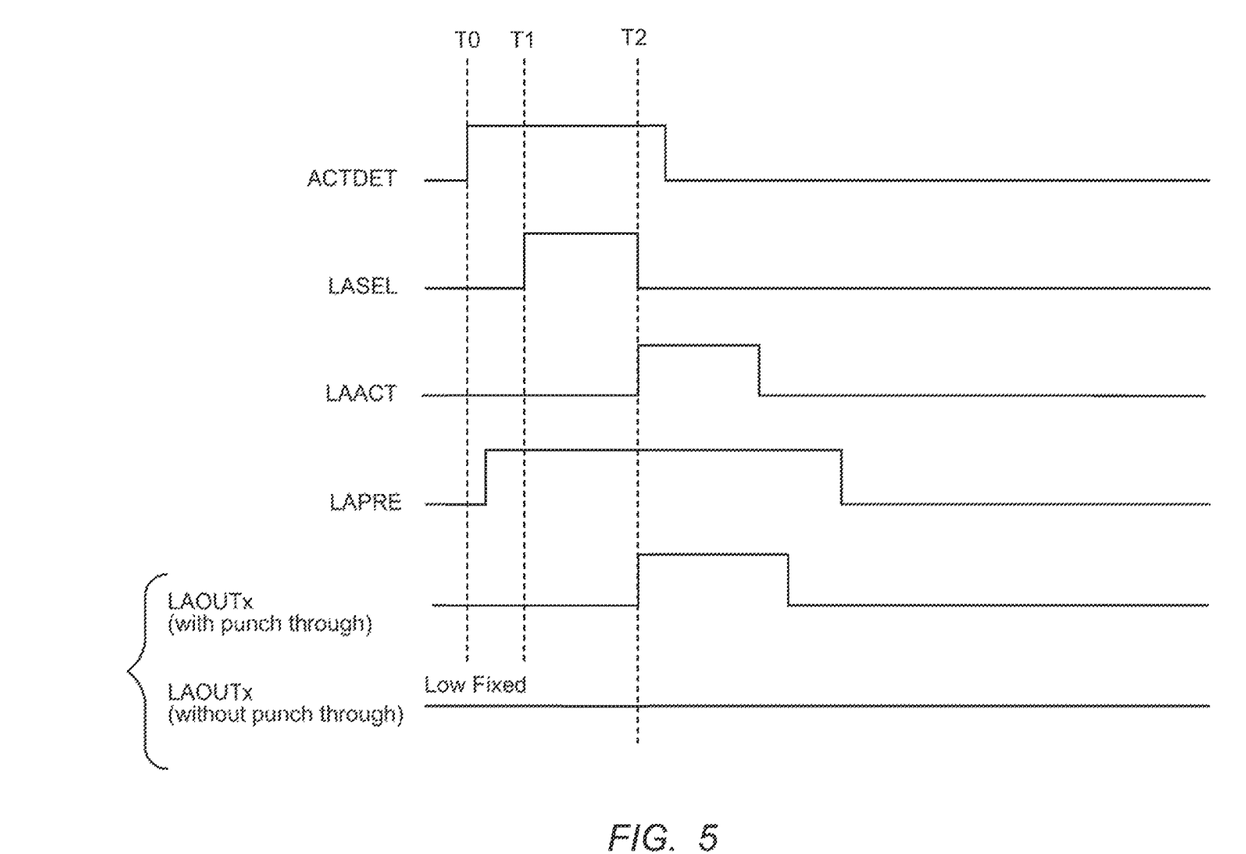
FIG. 5 is a timing diagram illustrating operation of the reference current detection circuit, current detection circuits, and latches according to an embodiment of the present disclosure.

FIG. 5 is a timing diagram 500 illustrating operation of the reference current detection circuit 461, current detection circuits 462(0)-462(N), and the latches 470(0)-470(N). As shown in the timing diagram, at time T0, the ACTDET signal transitions high. The differential amplifier circuit of the reference current detection circuit 461 and the differential amplifier circuit of the current detection circuit 462(0) are each activated when the ACTDET signal transitions to a high logical value. The ACTDET signal may enable the transistors 413, 414, 415, 418, and 419.

As previously described with reference to FIGS. 9A-9C, for example, the AFDLP0 signal is applied with a low voltage (e.g., the V2 voltage). The IPT current may vary depending on the state of a fuse element coupled to the AFDLP0 signal line. For example, if the fuse element has a defect allowing a punch through current, then the IPT current may be higher as compared with a fuse element that has no defect allowing a punch through current. When the IPT current flows because the coupled fuse element has a defect, the DETV0 signal may transition to a lower logical value (e.g., and reduce impedance of the transistor 412) to compensate for the increase in current through the fuse element and hold the voltage of the AFDLP0 line at a constant voltage. When there is little or no IPT current because the fuse element has no defect or punch through, the DETV0 signal may transition to a high logical value (e.g., and increase impedance of the transistor 412) to compensate for the decrease in current through the fuse element and hold the voltage of the AFDLP0 line at a constant voltage. The reference current detection circuit 461 may operate similarly to the current detection circuit 462(0), except that the IREF current flows constantly though the transistors 413 and 415, and therefore the DETVR signal remains at a constant voltage relative to the V5 voltage source and the properties of the transistors 413 and 415 remain constant.

Between times T0 and T1, the LAPRE signal is set to precharge the latches 470(0)-470(N). Specifically, the LAPRE signal enables a transistor in each of the pass gates 482 and 484 to precharge the nodes between the pass gates 482 and 484 and the transistors 472 and 474, respectively, to the V2 voltage. At time T1, the select signal LASEL transitions to a logical high value. The LASEL signal enables the transistors 452 and 454 to couple the DETV0 and DETVR signals from the current detection circuit 462(0) and the reference current detection circuit 461 to the latch 470(0). At time T2, the LASEL signal transitions to a low logical value and the latch 470(0) is activated by a signal LAACT. The LAACT signal controls the transistor 456 to allow discharge via the transistors 472 and 474 based on the values of the DETV0 and DETVR signals. In response to the LAACT signal, the latch 470(0) latches a value at a gate of the pass gate 484, which is inverted via the inverter 485 to provide the latched output signal LAOUTx. The signal LAOUTx may transition to a high logical value when the IPT current is greater than the IREF current, and may remain at a low logical value when the IPT current is less than the IREF current. Because a defect in the fuse element that allows a punch-through current IPT may vary, a voltage drop caused by the IPT current may vary when comparing one fuse element to another. Thus, using a reference voltage and voltage comparison circuit to determine a state of a fuse element difficult. Implementing a current detection circuit to determine a state of a fuse element may provide a more reliable or robust method as compared with using a voltage comparison circuit.

Figure 6:
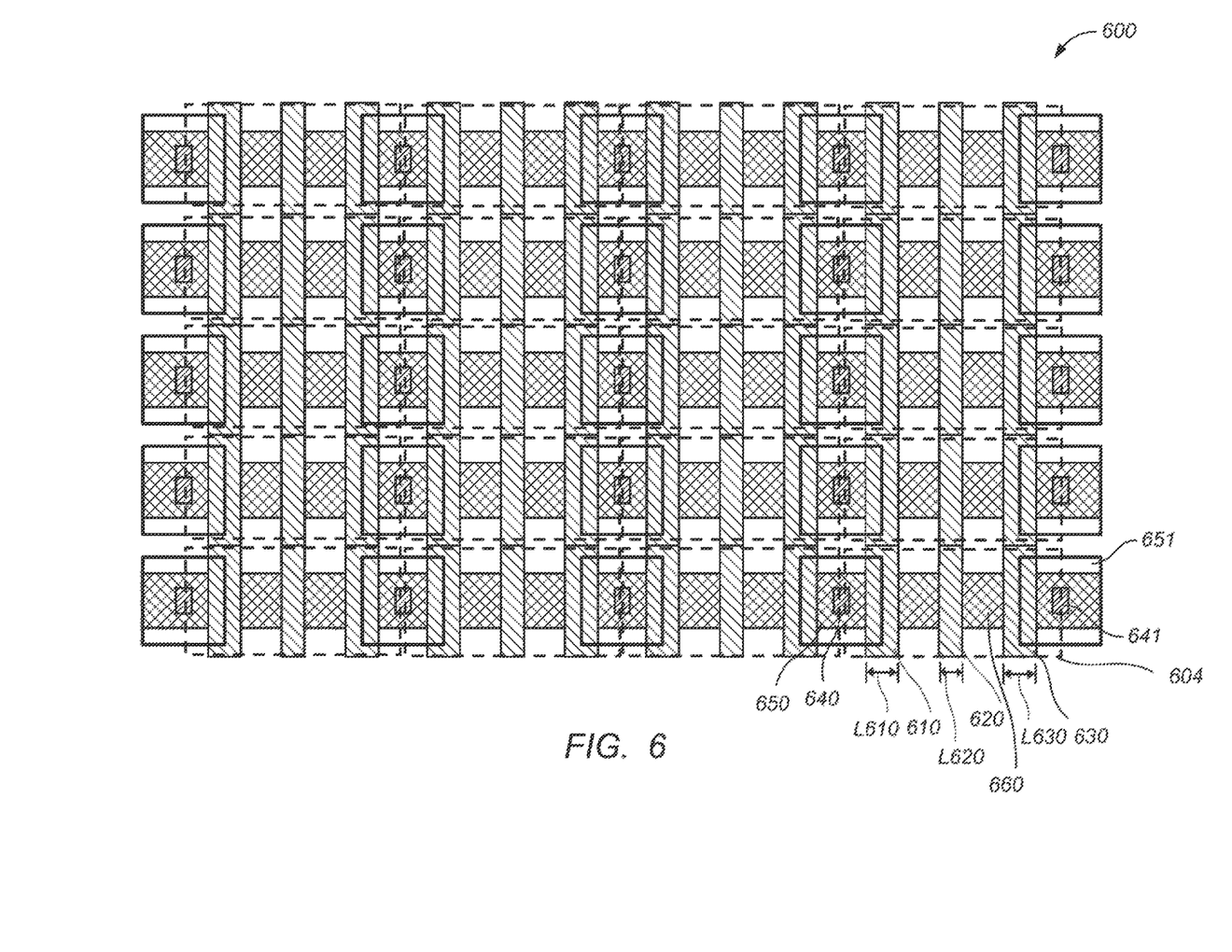
FIG. 6 is a diagram of an anti-fuse according to an embodiment of the present disclosure.

FIG. 6 is a diagram of an anti-fuse according to an embodiment of the present disclosure. The anti-fuse bank 600 may include a plurality of fuse elements, including the fuse element 604. The anti-fuse bank 600 includes 4 fuse elements along each row and 5 fuse elements along each column. It is appreciated that the anti-fuse bank 600 is exemplary may be expanded to include more fuse elements along each row or column, or may be reduced to include fewer fuse elements along each row or column. For clarity, only components of the fuse element 604 are specifically called out in FIG. 6. Details called out for the fuse element 604 apply other fuse elements of the anti-fuse bank 600. The anti-fuse bank 600 may be implemented in the redundant address circuit 150 of FIG. 1, the X anti-fuse bank circuitry 210 and/or the Y anti-fuse bank circuitry 212 of FIG. 2, the anti-fuse bank 310 of FIG. 3, or combinations thereof.

The fuse element 604 may include three MOS transistors, identified by their gates: a gate 610 is associated with a first transistor, a gate 620 is associated with a middle transistor, and a gate 630 is associated with a third transistor. The fuse element 604 may include a contact 640 and metal 650 to couple to a first data line (e.g., the AFDLPx or the AFDLSx data line) and a contact 641 and metal 651 to couple to a second data line (e.g., the other of the AFDLPx or the AFDLSx data line). The fuse element 604 may further include an N-type diffusion region 660 that is coupled to the contact 641. Similar N-type diffusion regions are included to couple to the contact 640, and to couple the first, second and third transistors together serially. As depicted in FIG. 6, a length of the gate 620 of the middle transistor may be shorter than a length of the gates 610 and 630 of the first and third transistors (e.g., the length L620 is shorter than the length L610 or the length L630).

As depicted in FIG. 6, the fuse elements may be arranged adjacent to each other and share some common components, such as the contact 640 and metal 650. This arrangement may allow for a higher density application as compared with arranging the fuse elements using entirely separate contacts and metal components.

Figure 7A:
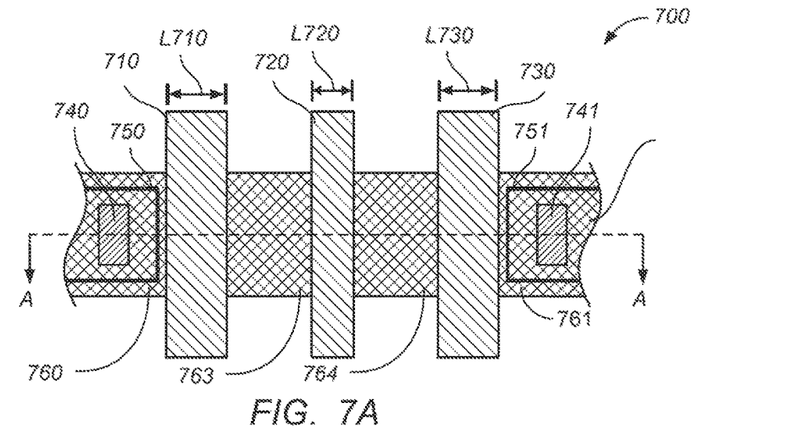
FIGS. 7A-7C are diagrams of an anti-fuse element 700 according to an embodiment of the present disclosure.
Figure 7B:
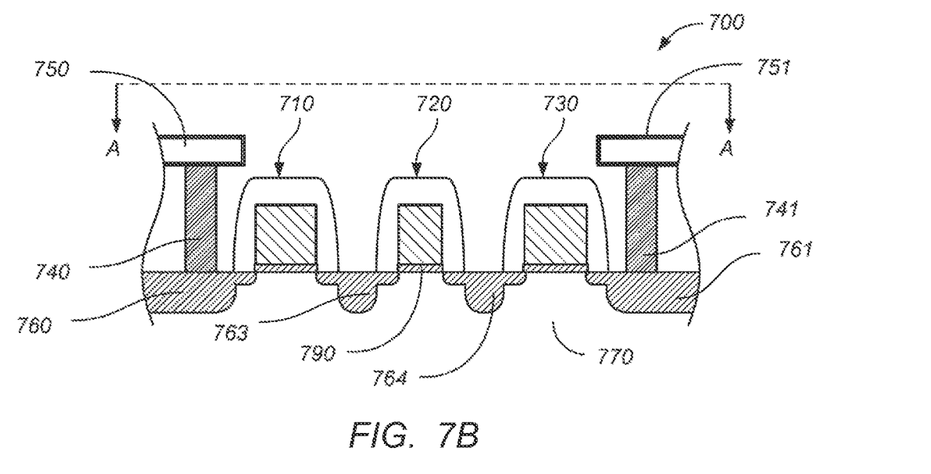
Figure 7C:
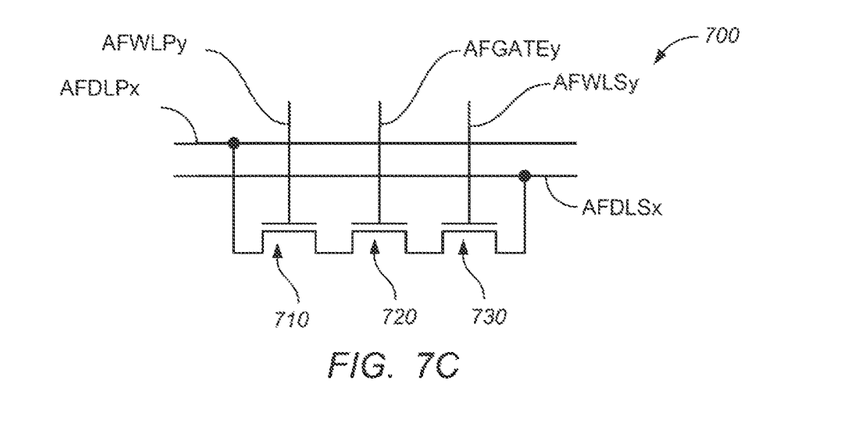

FIGS. 7A-7C are diagrams of an anti-fuse element 700 in accordance with an embodiment of the disclosure. FIG. 7A is a first view of the anti-fuse element 700, FIG. 7B is a cross-sectional view of the anti-fuse element 700, and FIG. 7C is a circuit diagram of the anti-fuse element 700. The anti-fuse element 700 may be implemented in the redundant address circuit 150 of FIG. 1, the X anti-fuse bank circuitry 210 and the Y anti-fuse bank circuitry 212 of FIG. 2, the anti-fuse bank 310 of FIG. 3, the anti-fuse bank 600 of FIG. 6, or combinations thereof.

The anti-fuse element 700 may include three MOS transistors, identified by their gates: a gate 710 is associated with a first transistor, a gate 720 is associated with a middle transistor, and a gate 730 is associated with a third transistor. The anti-fuse element 700 may include a contact 740 and metal 750 to couple to a first data line (e.g., the AFDLPx data line) and a contact 741 and metal 751 to couple to a second data line (e.g., the AFDLSx data line). The gate 710 may be coupled to a first wordline (e.g., the AFWLPy wordline), the gate 720 may be coupled to a second wordline (e.g., the AFGATEy wordline), and the gate 730 may be coupled to a third wordline (e.g., the AFWLSy wordline). The anti-fuse element 700 may further include an N-type diffusion region 760 coupled to the contact 740, an N-type diffusion region 761 coupled to the contact 741, an N-type diffusion region 763 coupled between gates 610 and 720, and an N-type diffusion region 764 between gate 720 and gate 730. The N-type diffusion regions 763 and 764 couple the first, second, and third transistors together serially. The anti-fuse element 700 may further include a gate insulation layer 790 under the gate 720. Voltages on the wordlines AFWLPy, AFWLSy, and AFGATEy and the datalines AFDLPx and AFDLSx may serve to read a state of or program the anti-fuse element 700.

When programmed, the gate insulation layer 790 is compromised to form a defect that allows a punch-through current to flow from the N-type diffusion region 763 through a channel under the gate 720 to the N-type diffusion region 764 when a value of the AFGATEy signal has a low logical value (e.g., the V1 voltage). As depicted in FIG. 7, a length L720 of the gate 720 of the middle transistor may be shorter than a length L710 of the gate 710 and the length L730 of the gate 730 of the first and third transistors. The shorter gate 720 may allow a channel to form with a smaller defect to allow a punch through current IPT to flow when the anti-fuse element 700 is programmed.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus comprising:
   an anti-fuse bank comprising a plurality of anti-fuse elements, wherein an anti-fuse element comprises first, second, and third transistors coupled in series between first and second nodes such that the second transistor is between the first and third transistor wherein length of a gate of the second transistor is different than a length of a gate of the first transistor;
   a detection circuit coupled to the anti-fuse bank and comprising a plurality of current detection circuits, wherein, during a read operation, a current detection circuit of the plurality of current detection circuits is configured to provide a detection signal having a value based on a punch-through current through the anti-fuse bank; and
   a latch circuit coupled to the detection circuit and comprising a plurality of latches, wherein, during the read operation, the latch circuit is configured to provide a latch signal indicative of a state of the anti-fuse element based on a value of the detection signal.

2. The apparatus of claim 1, wherein during the read operation, the latch circuit is configured to compare the detection signal with a reference detection signal to provide the latch signal.

3. The apparatus of claim 2, further comprising a reference current detection circuit configured to provide the reference detection signal based on a reference current.

4. An apparatus comprising:
   an anti-fuse bank comprising a plurality of anti-fuse elements, wherein an anti-fuse element comprises first, second, and third transistors coupled in series between first and second nodes such that the second transistor is between the first and third transistor wherein length of a gate of the second transistor is different than a length of a gate of the first transistor;

a detection circuit coupled to the anti-fuse bank and comprising a plurality of current detection circuits, wherein, during a read operation, a current detection circuit of the plurality of current detection circuits is configured to provide a detection signal having a value based on a punch-through current through the anti-fuse bank, wherein the current detection circuit comprises:

a constant voltage circuit configured to drive a constant voltage on a data line coupled to the anti-fuse element, wherein the punch-through current flows along the data line; and a differential amplifier coupled to the data line and is configured to provide the detection signal based on the punch-through current flowing along the data line; and a latch circuit coupled to the detection circuit and comprising a plurality of latches, wherein, during the read operation, the latch circuit is configured to provide a latch signal indicative of a state of the anti-fuse element based on a value of the detection signal.

5. The apparatus of claim 1, further comprising:

a column selector configured to provide a first voltage to a gate of the first transistor and a second voltage to a gate of the third transistor during the read operation;

a first row selector configured to provide a third voltage to the first node during the read operation;

a second row selector configured to provide a fourth voltage to the second node during the read operation; and an anti-fuse gate selector configured to provide a fifth voltage to a gate of the second transistor during the read operation.

6. The apparatus of claim 5, wherein the fourth and fifth voltages are equal and the first and third voltages are equal.

7. The apparatus of claim 5, wherein, during a program operation:

the column selector configured to provide the fourth voltage to a gate of the first transistor and to a gate of the third transistor;

the first row selector configured to provide the second voltage to the first node;

the second row selector configured to provide the second voltage to the second node; and the anti-fuse gate selector configured to provide a sixth voltage to the gate of the second transistor.

8. The apparatus of claim 7, wherein the sixth voltage is greater than the first, second, third, fourth, and fifth voltages.

* * * * *